United States Patent
Smelloy et al.

(10) Patent No.: US 7,514,978 B2
(45) Date of Patent: Apr. 7, 2009

(54) TERMINATED INPUT BUFFER WITH OFFSET CANCELLATION CIRCUIT

(75) Inventors: Yossi Smelloy, Mizpe Kamun (IL); Ronen Eckhouse, Yuvalim (IL)

(73) Assignee: Mellanox Technologies Ltd., Yokneam (IL)

( * ) Notice: Subject to any disclaimer, the term of this patent is extended or adjusted under 35 U.S.C. 154(b) by 18 days.

(21) Appl. No.: 11/744,891

(22) Filed: May 7, 2007

(65) Prior Publication Data

US 2007/0258546 A1    Nov. 8, 2007

Related U.S. Application Data

(60) Provisional application No. 60/746,654, filed on May 8, 2006.

(51) Int. Cl.
*H03L 5/00* (2006.01)
(52) U.S. Cl. .......................................... 327/307; 330/9
(58) Field of Classification Search ................. 327/307; 330/9
See application file for complete search history.

(56) References Cited

U.S. PATENT DOCUMENTS

| 4,760,286 | A | 7/1988 | Pigott |
| 4,827,222 | A | 5/1989 | Hester et al. |
| 6,507,241 | B1 * | 1/2003 | Ritter ............................. 330/9 |
| 6,549,054 | B2 * | 4/2003 | Ono ............................. 327/307 |
| 2004/0189369 | A1 * | 9/2004 | Tobita .......................... 327/307 |
| 2005/0018576 | A1 * | 1/2005 | Kao et al. ................. 369/59.17 |

* cited by examiner

*Primary Examiner*—Long Nguyen
*Assistant Examiner*—Brandon S Cole
(74) *Attorney, Agent, or Firm*—Mark M. Friedman

(57) ABSTRACT

A system and method for compensation of offset voltage in a digital differential input buffer driven by a terminated transmission line. Offset compensation currents are injected at the output of the first stage of the input buffer, which has a higher impedance than the terminated transmission line at the input of the buffer. The compensation current is determined by a network of MOS transistors, which saves die space compared to resistors. A pair of voltage multiplexers provides for compensation currents to correct offsets of either polarity. Offset correction currents are determined anew each time the system is powered up, compensating for component aging. The offset correction can also be performed while the input buffer is operating, during periods when the input is quiescent, and/or by adjusting the offset correction according to the duty cycle of the detected input.

7 Claims, 2 Drawing Sheets

US 7,514,978 B2

TERMINATED INPUT BUFFER WITH OFFSET CANCELLATION CIRCUIT

This is a continuation-in-part of U.S. Provisional Patent Application No. 60/746,654, filed May 8, 2006

FIELD AND BACKGROUND OF THE INVENTION

The present invention relates to a high-speed receiver for digital communications and, more particularly, to a system and method for cancellation of offset voltage of a differential input buffer.

Serial high-bandwidth communication requires terminated input buffers with sensitivity in the range of several mV. Input stage manufacturing offset is usually also in range of several mV. The manufacturing offset can not be diminished by enlarging the size of the MOS devices used in the input buffer due to input return-loss constraints. Moreover, a termination resistor is required between the differential inputs in order to match the impedance of the transmission medium. The termination resistor couples the differential inputs together and makes it difficult to cancel the offset by injecting compensating currents at the inputs of the buffer.

The present invention introduces an offset cancellation circuit at the differential outputs of the first differential amplification stage of the receiver, in contradistinction to the more common prior-art technique of placing the cancellation circuit at the inputs of this first differential amplification stage. The cancellation circuit is composed of a differential output transistor pair with a controlled DC input voltage. In addition, the cancellation method is described.

Various attempts have been made to cancel offset voltage in differential inputs.

U.S. Pat. No. 4,827,222 to Hester, et al. introduces trimming of input offset voltage of a differential amplifier using a pair of resistance networks which are connected to the emitters of a pair of current mirror transistors. The offset is corrected by fuse-selected resistor strings which take up significantly more area on an integrated circuit die than the MOS transistors used in the present invention.

U.S. Pat. No. 4,760,286 to Pigott cancels the offset in a PNP comparator circuit by driving unequal currents to the PNP transistors to eliminate offset in the input devices. This solution requires the use of multicollector PNP transistors, and is not applicable to MOS systems.

Furthermore, prior-art solutions do not compensate for changes in offset voltage due to aging of circuit components. In the present invention the currents to be applied for offset voltage compensation are determined anew at system startup, and can even be adjusted during system operation.

There is thus a widely recognized need for, and it would be highly advantageous to have, a system and method for correcting offset voltage in terminated MOS input buffers, with compensation for aging of circuit components, having compact MOS circuitry rather than resistors for providing compensation currents, and not requiring the blowing of fuses, as provided by the present invention.

Definitions

As used herein, unless otherwise specified, the term "driving" refers to providing a signal input to a device. For example, a signal source connected to an amplifier "drives" the amplifier, and can be said to be "drivingly connected" to the amplifier. The control of a device via intermediate devices is also included within the scope of this definition. Thus, for example, a signal which controls a final amplifier via intermediate amplifiers is also said to be drivingly connected to the final amplifier.

SUMMARY OF THE INVENTION

According to the present invention there is provided a system for receiving digital data, the system including: (a) an input buffer including at least a first differential amplifier; (b) a comparator, and (c) a compensation mechanism separate from the comparator, wherein respective differential outputs of the first differential amplifier are drivingly connected to corresponding inputs of the comparator, and wherein respective outputs of the compensation mechanism are also drivingly connected to corresponding inputs of the comparator, the outputs of the compensation mechanism being operational to drive corresponding compensation currents into the respective inputs of the comparator so as to substantially cancel an offset voltage of the differential amplifier, and wherein the compensation currents are determined using feedback from the comparator after application of power to the system.

It is to be noted that the comparator and the compensation mechanism are considered "separate" if these components are implemented in separate circuitry, although these components can be fabricated on the same semiconductor die, and it is indeed preferable that these components be fabricated on the same die.

Preferably, in the system the compensation mechanism includes a current-control network including: (i) at least one current-control subnetwork including at least one transistor, and (ii) a switch in series with each current-control subnetwork, wherein each respective series switch is operative independently to switch a current of a corresponding current-control subnetwork.

Preferably, in the system the current-control subnetwork includes at least one MOS transistor.

Preferably, the compensation mechanism includes: (i) a first resistor; (ii) a second resistor; (iii) a current source; (iv) a first voltage multiplexer, and (v) a second voltage multiplexer, wherein a first terminal of the first resistor is connected to a voltage source, a second terminal of the first resistor is connected to a first terminal of the second resistor, a second terminal of the second resistor is connected to the current source, the first terminal of the second resistor is also connected to a first terminal of the first voltage multiplexer and to a first terminal of the second multiplexer, the second terminal of the second resistor is connected to a second terminal of the first multiplexer and to a second terminal of the second multiplexer, and wherein a control input of the first multiplexer is operated in a complementary fashion to operation of a control input of the second multiplexer, and wherein outputs of the multiplexers are drivingly connected to the outputs of the compensation mechanism.

Preferably, in the system the current source and the multiplexers are set according to feedback from the comparator.

Preferably, the system further includes: (d) a second differential amplifier drivingly connected to the first differential amplifier.

Preferably, the system further includes: (d) a second differential amplifier driven by the first differential amplifier and drivingly connected to the comparator.

Preferably, the system further includes: (d) a low-pass filter, driven by an output of the comparator, and operative to produce an output signal proportional to a duty cycle of the comparator output, and wherein the compensation currents are adjusted so as to cause the duty cycle of the comparator to be substantially equal to a pre-determined duty cycle.

According to the present invention there is provided a method for compensating offset voltage in a digital differential input having a differential amplifier, the method including the steps of: (a) providing a comparator having inputs driven by outputs of the differential amplifier; (b) calibrating the differential input by injecting a sequence of trial compensation currents into the inputs of the comparator while monitoring a first output of the comparator, and (c) upon detecting a change of state of the first output of the comparator, selecting compensation currents substantially equal to the trial compensation currents corresponding to the change of state, for injection into the inputs of the comparator so as to substantially compensate the offset of the differential input.

Preferably, in the method step (b) is performed upon application of power to the digital differential input.

Preferably, in the method step (b) is performed upon detection of a quiescent input signal.

Preferably, the method further includes the step of: (d) operating the digital differential input while injecting the selected compensation currents into the inputs of the comparator.

Preferably, in the method the sequence of trial compensation currents is monotonic.

Preferably, the method further includes the steps of: (d) measuring a duty cycle of a second output of the comparator; (e) comparing the measured duty cycle with a pre-determined target duty cycle, and (f) adjusting the selected compensation currents according to the comparison.

It is to be noted that the above-mentioned "first" output of the comparator, which is used for calibration, and the above-mentioned "second" output of the comparator, which is used for duty cycle measurement, may or may not be the same output of the comparator.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a terminated input buffer with compensation for offset voltage resulting from manufacturing tolerances and/or component aging. Specifically, the present invention introduces compensation currents at the output of the first input buffer stage rather than the input, in contradistinction to prior art.

The principles and operation of a terminated input buffer according to the present invention may be better understood with reference to the drawings and the accompanying description.

Figure 1:
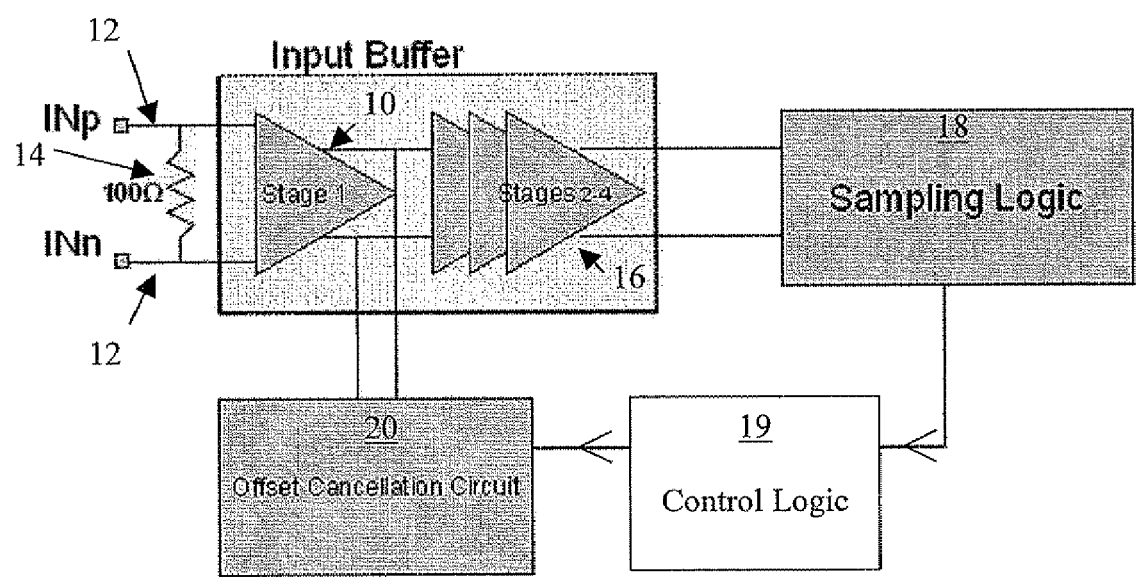
FIG. 1 schematically illustrates a system according to the present invention.

Referring now to the drawings, FIG. 1 illustrates schematically a terminated input buffer according to the present invention. A first differential amplifier 10 receives digital input data from a transmission line 12 terminated by a terminating resistor 14. Optionally, first differential amplifier 10 can be preceded by additional stages of amplification (not shown). Output of amplifier 10 is, optionally, further amplified by additional amplifiers 16. Sampling logic 18 compares the differential outputs of amplifiers 16. During system startup, at a time that no input signal is being presented to the system, a control logic 19 applies, via an offset cancellation circuit 20, a sequence of trial compensation currents to the outputs of amplifier 10. In one implementation of the present invention this trial sequence is monotonic. The level of trial compensation current that causes a change in the logic level sensed by sampling logic 18 indicates the point of maximum sensitivity, and that level of compensation current is applied to the outputs of amplifier 10 during operation of the input buffer.

Although the use of a monotonic sequence of trial compensation currents for determining the compensation currents to be applied during operation is relatively simple to implement, and in many cases is fast enough to complete the compensation process without causing the start-up interval to be unduly long, it will be appreciated by those skilled in the art that other sequences of trial compensation currents can converge more quickly on the proper compensation currents to be used during system operation, thus shortening the start-up interval. The use of such other trial sequences is also within the scope of the present invention.

Figure 2:
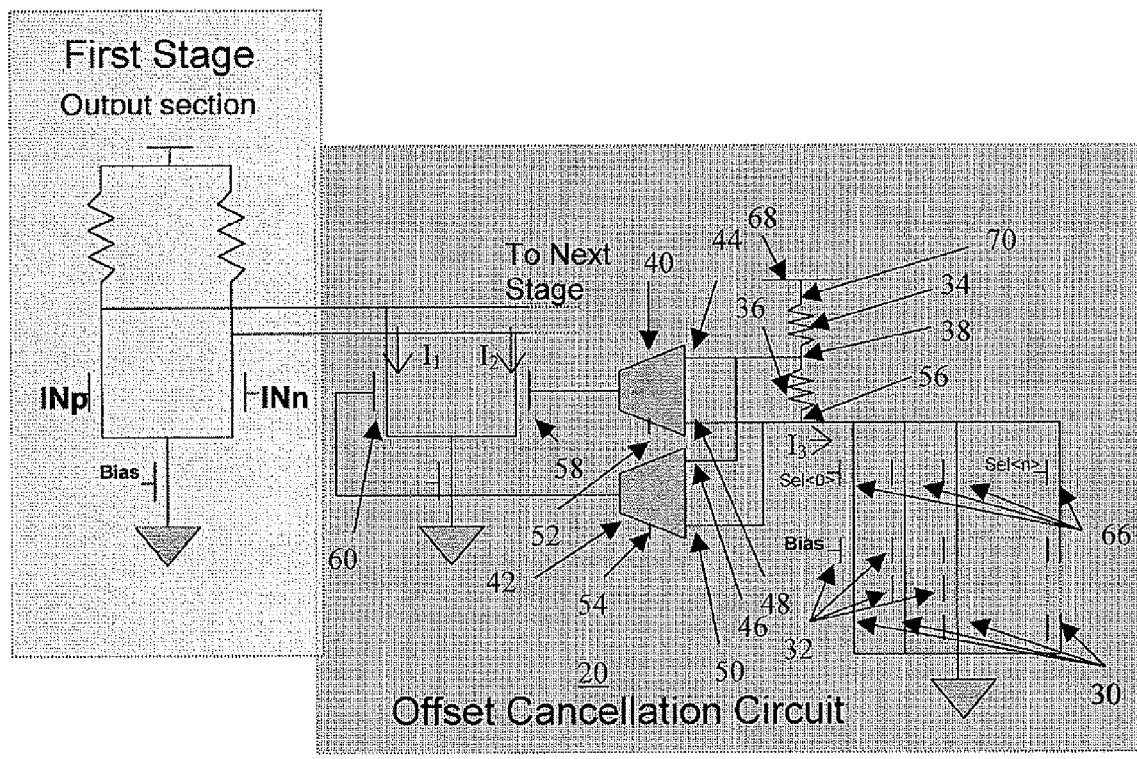
FIG. 2 schematically illustrates the offset cancellation circuit of a system according to the present invention.

Operation of offset cancellation circuit 20 is now explained in further detail. Referring now to FIG. 2, several strings 30 of matched MOS transistors 32 are provided, each transistor 32 having the same bias voltage at its gate. Transistors 32 draw current from a voltage source 68 via a resistor string consisting of resistors 34 and 36, voltage source 68 being connected to a first terminal 70 of resistor 34. Preferably, the current drawn by each string 30 of transistors 32 is selected such that a first string 30 draws a set current when a corresponding switch transistor 66 is turned on, and each respective other string 30 draws a current that is a respective power of two times the current drawn by the first string 30 when a corresponding switch transistor 66 is turned on.

The total current flowing through strings 30, and thus through resistors 34 and 36, creates a voltage difference across resistor 36. The voltage at a first terminal 38 of resistor 36 is fed to corresponding first inputs 44 and 46 of each of two respective voltage multiplexers 40 and 42. The voltage at a second terminal 56 of resistor 36 is fed to corresponding second inputs 48 and 50 of respective voltage multiplexers 40 and 42.

Corresponding control inputs 52 and 54 of respective multiplexers 40 and 42 are driven by control logic 19 in a complementary fashion, such that the output of multiplexer 40 is driven by the voltage at terminal 38 and the output of multiplexer 42 is driven by the voltage at terminal 56 when control input 52 is in a first logic state and control input 54 is in the complementary logic state, and the output of multiplexer 40 is driven by the voltage at terminal 56 and the output of multiplexer 42 is driven by the voltage at terminal 38 when the logic states of control inputs 52 and 54 are reversed.

The use of two voltage multiplexers 40 and 42 allows for correction of both positive and negative offsets. The current through respective resistors 34 and 36, and thus the voltages applied to corresponding transistors 58 and 60 to control the corresponding offset correction currents $I_1$ and $I_2$, is controlled by control logic 19 via switch transistors 66, each of which is operative to control whether or not an individual string 30 of transistors 30 contributes to current $I_3$ flowing through resistors 34 and 36.

In brief, the various possible settings of switch transistors 66, along with the two possible settings of multiplexers 40 and 42, provide a wide range of offset correction currents. Using feedback from sampling logic 18, settings for switch transistors 66 and multiplexers 40 and 42 that cancel offset are found, and these are the settings that are applied during operation of the system.

Offset correction currents $I_1$ and $I_2$ are applied to an output section 70 of first differential amplifier 10 of FIG. 1.

In addition to providing offset cancellation that is recalibrated anew each time the system is powered up, the present invention further provides for recalibration while the system is in operation, thus compensating for drift that may result from thermal effects, component aging in high-reliability systems that are in operation for extended periods, switching of, or changes in, external components that may be connected to the system, and/or other factors that can affect offset.

In one method for calibration during operation the system is operative to detect a quiescent period in transmission. Such quiescent, or idle, periods are present in many data transmission protocols, providing an opportunity to recalibrate the offset correction of the receiver. When a quiescent period is detected, a system according to the present invention can initiate an offset calibration procedure as described above. If a transmission is detected during the calibration procedure, the calibration procedure can be interrupted and normal reception resumed using the previous calibration values until another opportunity to recalibrate is detected. If the calibration procedure interferes with proper reception of the interrupting transmission this interference can be detected and corrected by error detection and correction schemes that are well-known in the art. An interrupted offset calibration procedure can be started over in a subsequent quiescent period.

Another method for calibration during operation relies on the long-term duty cycle of transmitted data in many protocols having a pre-determined value, typically 0.5. In such a case, the output of sampling logic 18 can be fed to a low-pass filter included within control logic 19. Feedback of deviations of the output of this filter from the output that would correspond to that expected from a signal having the pre-determined long-term duty cycle can be used to adjust the offset correction.

While the invention has been described with respect to a limited number of embodiments, it will be appreciated that many variations, modifications and other applications of the invention may be made.

What is claimed is:

1. A system for receiving digital data, the system comprising:
    (a) an input buffer including at least a first differential amplifier;
    (b) a comparator, and
    (c) a compensation mechanism separate from said comparator,
    wherein respective differential outputs of said first differential amplifier are drivingly connected to corresponding inputs of said comparator, and wherein respective outputs of said compensation mechanism are also drivingly connected to corresponding said inputs of said comparator, said outputs of said compensation mechanism being operational to drive corresponding compensation currents into said respective inputs of said comparator so as to substantially cancel an offset voltage of said differential amplifier,
    and wherein said compensation currents are determined using feedback from said comparator after application of power to the system,
    and wherein said compensation mechanism includes:
    (i) a first resistor;
    (ii) a second resistor;
    (iii) a current source;
    (iv) a first voltage multiplexer, and
    (v) a second voltage multiplexer,
    wherein a first terminal of said first resistor is connected to a voltage source, a second terminal of said first resistor is connected to a first terminal of said second resistor, a second terminal of said second resistor is connected to said current source, said first terminal of said second resistor is also connected to a first terminal of said first voltage multiplexer and to a first terminal of said second multiplexer, said second terminal of said second resistor is connected to a second terminal of said first multiplexer and to a second terminal of said second multiplexer, and wherein a control input of said first multiplexer is operated in a complementary fashion to operation of a control input of said second multiplexer, and wherein outputs of said multiplexers are drivingly connected to said outputs of said compensation mechanism.

2. The system of claim 1, wherein said compensation mechanism includes a current-control network including:
    (i) at least one current-control subnetwork including at least one transistor, and
    (ii) a switch in series with each said current-control subnetwork,
    wherein each respective said series switch is operative independently to switch a current of a corresponding said current-control subnetwork.

3. The system of claim 2, wherein a said current-control subnetwork includes at least one MOS transistor.

4. The system of claim 1 wherein said current source and said multiplexers are set according to feedback from said comparator.

5. The system of claim 1 further comprising:
    (d) a second differential amplifier drivingly connected to said first differential amplifier.

6. The system of claim 1 further comprising:
    (d) a second differential amplifier driven by said first differential amplifier and drivingly connected to said comparator.

7. The system of claim 1 further comprising:
    (d) a low-pass filter, driven by an output of said comparator, and operative to produce an output signal proportional to a duty cycle of said comparator output,
    and wherein said compensation currents are adjusted so as to cause said duty cycle of said comparator to be substantially equal to a pre-determined duty cycle.

* * * * *